(12) United States Patent
Wang et al.

(10) Patent No.: US 7,588,971 B2
(45) Date of Patent: Sep. 15, 2009

(54) METHOD OF FABRICATING VERTICAL THIN FILM TRANSISTOR

(75) Inventors: Yi-Kai Wang, Hsinchu (TW); Tsung-Hsien Lin, Hsinchu (TW); Tarng-Shiang Hu, Hsinchu (TW); Yu-Yuan Shen, Dounan Township, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 187 days.

(21) Appl. No.: 11/778,668

(22) Filed: Jul. 17, 2007

(65) Prior Publication Data

US 2008/0014686 A1 Jan. 17, 2008

(51) Int. Cl.
  *H01L 29/786* (2006.01)
  *H01L 21/84* (2006.01)
(52) U.S. Cl. .............. 438/149; 438/151; 438/156; 257/E51.007; 257/E29.274
(58) Field of Classification Search ......... 438/149–156, 438/212, 268; 257/E29.274, E51.007
See application file for complete search history.

(56) References Cited

U.S. PATENT DOCUMENTS

| | | | |
|---|---|---|---|
| 6,107,660 A | | 8/2000 | Yang et al. |
| 6,320,221 B1 | | 11/2001 | Choi et al. |
| 6,403,396 B1 | | 6/2002 | Gudesen et al. |
| 6,429,060 B1 | * | 8/2002 | Itoh et al. ............ 438/197 |
| 6,472,705 B1 | | 10/2002 | Bethune et al. |
| 6,576,976 B2 | | 6/2003 | Lien et al. |
| 6,664,576 B1 | | 12/2003 | Breen et al. |
| 6,746,904 B2 | * | 6/2004 | Van der Zaag et al. ....... 438/149 |
| 6,747,287 B1 | * | 6/2004 | Toguchi et al. .............. 257/40 |
| 2003/0098509 A1 | * | 5/2003 | Kamiya et al. ............. 257/758 |
| 2003/0170937 A1 | * | 9/2003 | Eccleston .................. 438/151 |
| 2005/0130422 A1 | * | 6/2005 | Theiss ....................... 438/689 |
| 2006/0125025 A1 | * | 6/2006 | Kawashima et al. ......... 257/401 |

FOREIGN PATENT DOCUMENTS

| | | |
|---|---|---|
| TW | 417294 | 1/2001 |
| TW | 505813 | 10/2002 |
| TW | 575963 | 2/2004 |

* cited by examiner

*Primary Examiner*—Thanh V Pham
*Assistant Examiner*—Duy T Nguyen
(74) *Attorney, Agent, or Firm*—Jianq Chyun IP Office

(57) ABSTRACT

A method of fabricating a vertical thin film transistor (vertical TFT) is disclosed, wherein a shadow mask is used to fabricate the TFT device in vertical structure. First, a metal layer is formed, which serves as ribs and a gate layer. Next, a shadow mask is disposed on the gate layer. Afterwards, the shadow mask is used as a mask to form a source layer, an organic semiconductor layer and a drain layer. Thus, the process is simplified. Since no photolithography process is required, and therefore damage of the organic semiconductor layer is avoided and a vertical TFT with desired electrical characteristics may be obtained.

10 Claims, 6 Drawing Sheets

METHOD OF FABRICATING VERTICAL THIN FILM TRANSISTOR

BACKGROUND OF THE INVENTION

1. Field of the Invention

The present invention relates to a semiconductor device, and more particularly, to a method of fabricating a vertical thin film transistor (vertical TFT).

2. Description of the Related Art

As a newly emerged technique today, a lightweight, ultra-thin, portable and flexible display, such as an electronic paper (e-paper; e-ink), has attracted more attention of customers than ever before. Meanwhile, many manufacturers follow such development train one after another. The organic thin film transistor (OTFT) is a TFT suitable for varied electronic products by adopting an organic molecular material. The most remarkable advantage of an OTFT resides in it can be fabricated under a lower temperature and retain the designed characteristic of a transistor device to obtain the normal display quality. Along with the widespread applications of OTFTs, the flexible electronic products, such as the flexible displays, are expected to share more market soon.

The advantage of an OTFT in vertical structure resides in a higher mobility thereof, friendliness to the higher frequency applications and a lower operation bias voltage. However, the OTFT in vertical structure is difficult to be fabricated. By using the conventional semiconductor process to fabricate an OTFT device in vertical structure, normally, multiple coating processes and multiple patterning processes are conducted, which requires multiple masks. Such a complex fabrication process tends to increase the production cost. In particular, the characteristic of the organic semiconductor after a photolithography process, which makes the fabricated OTFT in vertical structure fail to retain the expected good characteristic.

SUMMARY OF THE INVENTION

An objective of the present invention is to provide a method of fabricating a vertical TFT capable of simplifying the process of an OTFT in vertical structure.

Another objective of the present invention is to provide a method of fabricating a vertical TFT capable of fabricating an OTFT in vertical structure at a lower temperature.

Another yet objective of the present invention is to provide a method of fabricating a vertical TFT such that the operation bias voltage of the OTFT can be lowered and the better device characteristic thereof can be improved.

The present invention provides a method of fabricating a vertical TFT including the following steps. First, a substrate is provided, on which a patterned gate layer has be formed. Next, a shadow mask is disposed on the gate layer, wherein the shadow mask has an opening to expose a portion of the substrate at a side of the gate layer. Afterwards, using the shadow mask as the mask, a first source/drain layer, a semiconductor layer and a second source/drain layer are sequentially formed on the portion of the substrate exposed by the opening. Furthermore, after removing the shadow mask, a gate dielectric layer is formed between the gate layer and the stacked layer composed of the first source/drain layer, the semiconductor layer and the second source/drain layer.

According to an embodiment of the present invention, the material of the first source/drain layer and second source/drain layer are a conductive material.

According to an embodiment of the present invention, the first source/drain layer and second source/drain layer may be fabricated using, for example but not limited to, a physical vapor deposition process (PVD process), such as a sputtering process or a vapor deposition process.

According to an embodiment of the present invention, the material of the semiconductor layer is an organic semiconductor material or an inorganic semiconductor material.

According to an embodiment of the present invention, the semiconductor layer may include a N-type organic semiconductor material, a P-type organic semiconductor material, small molecule organic semiconductor material and macromolecule organic semiconductor material, or zinc oxide (ZnO) or doped inorganic semiconductor material.

According to an embodiment of the present invention, the semiconductor layer may be fabricate using, for example, a PVD process or a sputtering process, such as a sputtering process or a vapor deposition process.

According to an embodiment of the present invention, the gate dielectric layer may be fabricated using, for example but not limited to, a chemical vapor deposition process (CVD process), a printing process, a spin coating process, an ink-jetting process, a soaking process or a vapor deposition process.

According to an embodiment of the present invention, the substrate includes silicon substrate, flexible substrate or glass substrate.

In an embodiment of the present invention, since the gate layer thereof is defined at first, and the first source/drain layer, the semiconductor layer and the second source/drain layer are formed using the shadow mask as a mask, therefore the gate layer can function as ribs, so that the coating areas of the first source/drain layer, the semiconductor layer and the second source/drain layer can be precisely controlled after placing the shadow mask thereon, which provides the advantage of avoiding short circuit thereof.

Furthermore, by precisely controlling the thickness of the gate layer, the coating areas of the first source/drain layer, the semiconductor layer and the second source/drain layer can be precisely controlled and the risk of short circuit between the gate layer and the stacked layer can also reduced after forming the gate dielectric layer, and a thickness of the gate dielectric layer contributed by precisely controlling the thickness of the gate layer can reduce the operation bias voltage of the device and enables the device to have a lager start current.

Moreover, according to an embodiment of the present invention, after forming the semiconductor layer, no photolithography process is required, which would otherwise damage the semiconductor layer, and therefore a device with a reliable electrical characteristics may be obtained.

The present invention further provides a method of fabricating a vertical TFT. First, a substrate is provided, on which a first shadow mask is disposed, wherein the first shadow mask has a first opening to expose a portion of the substrate. Next, using the first shadow mask as the mask, a stacked layer composed of a first source/drain layer, a semiconductor layer and a second source/drain layer is formed on the exposed portion of the substrate. Then, after removing the first shadow mask, a gate dielectric layer is formed on the substrate. After that, a second shadow mask is disposed on the substrate, wherein the second shadow mask has a second opening to expose a side of the stacked layer. Next, using the second shadow mask as the mask, a gate layer is formed on the side of the stacked layer. Next, the second shadow mask is removed.

According to an embodiment of the present invention, the material of the first source/drain layer and second source/drain layer are a conductive material.

According to an embodiment of the present invention, the first source/drain layer and second source/drain layer may be formed by using, for example, a PVD process such as a sputtering process or a vapor deposition process.

According to an embodiment of the present invention, the material of the semiconductor layer is an organic semiconductor material or an inorganic semiconductor material.

According to an embodiment of the present invention, the semiconductor layer includes a N-type organic semiconductor material, a P-type organic semiconductor material, a small molecule organic semiconductor material or a macromolecule organic semiconductor material, or zinc oxide (ZnO) or doped inorganic semiconductor material.

According to an embodiment of the present invention, the semiconductor layer may be formed by using, for example, a PVD process such as a sputtering process or a vapor deposition process.

According to an embodiment of the present invention, the gate dielectric layer may be formed by using, for example, a CVD process, a printing process, a spin coating process, an ink-jetting process, a soaking process or a vapor deposition process.

According to an embodiment of the present invention, the substrate includes a silicon substrate, a flexible substrate or a glass substrate.

In an embodiment of the present invention, since the first shadow mask is used to fabricate the first source/drain layer, the semiconductor layer and the second source/drain layer, therefore, the coating areas and the coating thicknesses of the first source/drain layer, the semiconductor layer and the second source/drain layer can be precisely controlled.

After the gate dielectric layer is formed, the second shadow mask is used to fabricate the gate layer so that short circuit between the gate layer and the stacked layer may be effectively reduced. Furthermore, because the thickness of the gate dielectric layer is thin, the operation bias voltage of the device can be reduced and the device may have a larger start current.

Additionally, according to an embodiment of the present invention, after forming the semiconductor layer, no photolithography process is required, which would otherwise damage the semiconductor layer, and therefore a device with reliable electrical characteristics may be obtained.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

The First Embodiment

FIG. 1A~FIG. 1D are schematic views showing the process steps of fabricating a vertical OTFT according to a first embodiment of the present invention. FIG. 2A~FIG. 2D are schematic cross-sectional views along A-A' of FIG. 2A~FIG. 2D, respectively.

Figure 1A:
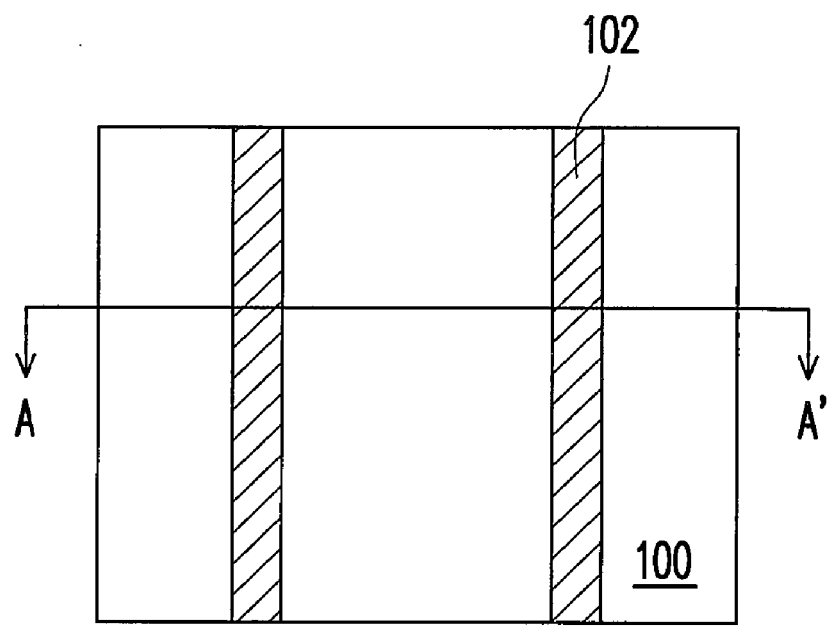
FIG. 1A~FIG. 1D are schematic top views showing the process steps of fabricating a vertical OTFT according to a first embodiment of the present invention.
Figure 2A:
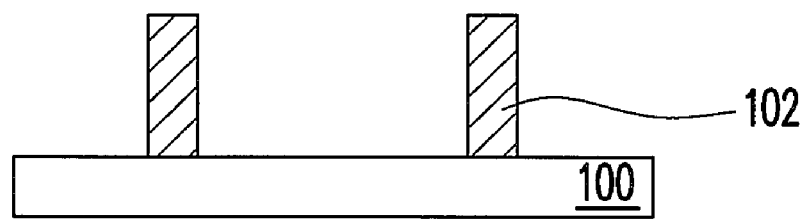
FIG. 2A~FIG. 2D are schematic cross-sectional views along A-A' of FIG. 2A~FIG. 2D, respectively.

Referring to FIGS. 1A and 2A, first, a substrate 100 is provided. The substrate 100 includes, for example, a plastic substrate, a silicon substrate, a flexible substrate or a glass substrate.

Next, a patterned gate layer 102 is formed on the substrate 100. The material of the patterned gate layer 102 includes a conductive material, for example, metal (aluminum, copper, molybdenum, chromium or alloy of the above-mentioned metals) or doped polysilicon. The method for forming the patterned gate layer 102 included, for example, using a shadow mask (not shown) as a mask, thereby a PVD process is performed to form the patterned gate layer 102 on the substrate 100. The PVD process includes, for example, a sputtering process or a vapor deposition process. Besides, the method for forming the patterned gate layer 102 may also include performing a common photolithography process by first forming a conductive material layer (not shown) on the substrate 100, forming a patterned photoresist layer (not shown) and then performing a photolithography process on the patterned photoresist layer to define the patterned gate layer 102. The patterned gate layer 102 may be arranged, for example, in bar-like alignment, so as to allow the shadow mask used for the successive processes to form the source/drain layers and the semiconductor layer to be placed on the patterned gate layer 102. In another embodiment, however, the patterned gate layer 102 can be column-like and arranged in an array on the substrate 100.

Figure 1B:
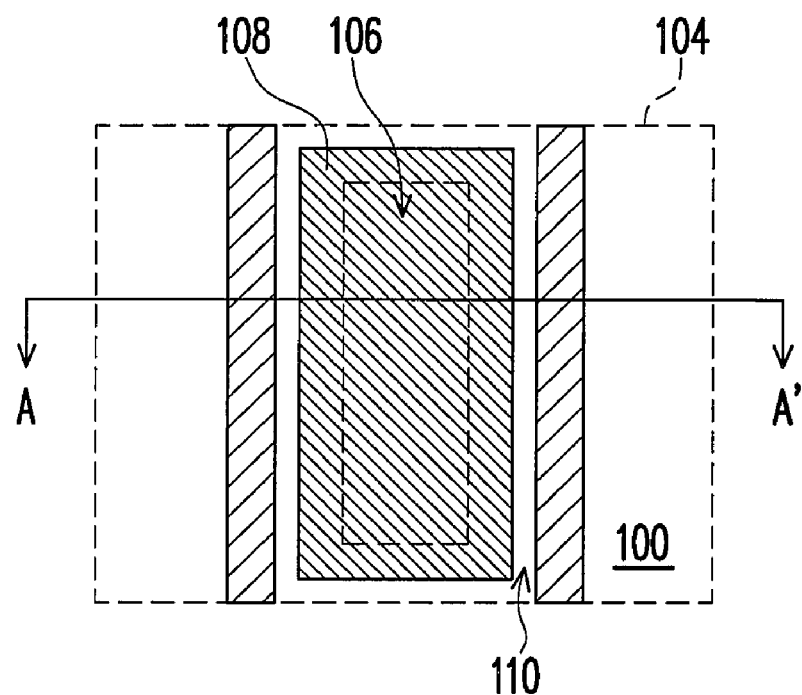
Figure 2B:
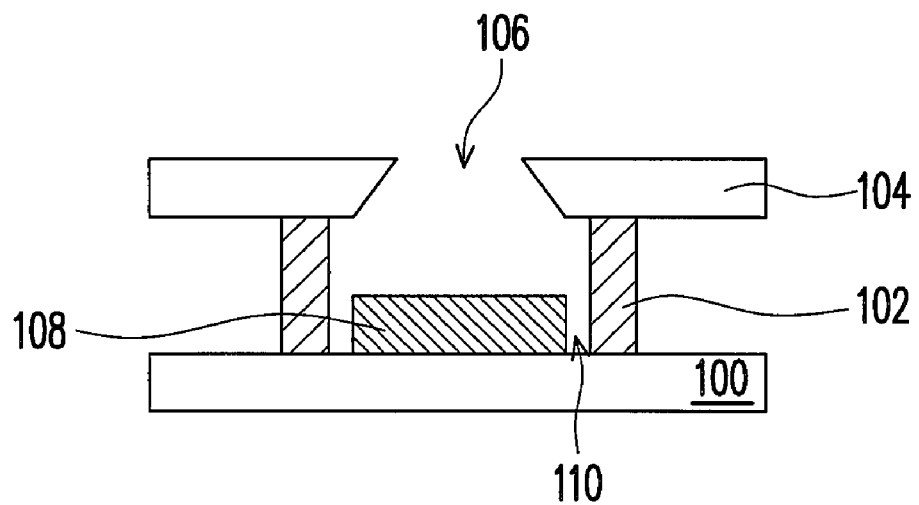

Referring to FIGS. 1B and 2B, a shadow mask 104 is placed on the gate layer 102. The shadow mask 104 can be disposed on the gate layer 102 in flat-fittingly contact manner. The shadow mask 104 has an opening 106 to expose a portion of the substrate 100 at a side of the gate layer 102. The material of the shadow mask 104 is, for example, thin steel sheet, silicon wafer or acrylic plate and the like.

Next, using the shadow mask 104 as the mask, a source/drain layer 108 is formed on a portion of the substrate 100 exposed by the opening 106. A gap 110 is formed between the source/drain layer 108 and the gate layer 102. The material of the source/drain layer 108 includes a conductive material, for example, metal (aluminum, copper, molybdenum, chromium or alloy of the above-mentioned metals). The method for forming the source/drain layer 108 includes PVD process, for example, a sputtering process or a vapor deposition process.

Figure 1C:
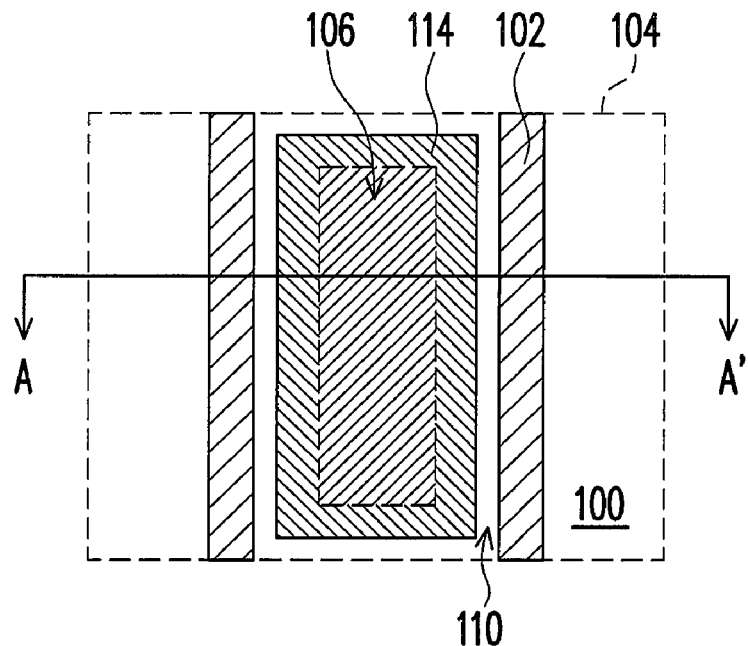
Figure 2C:
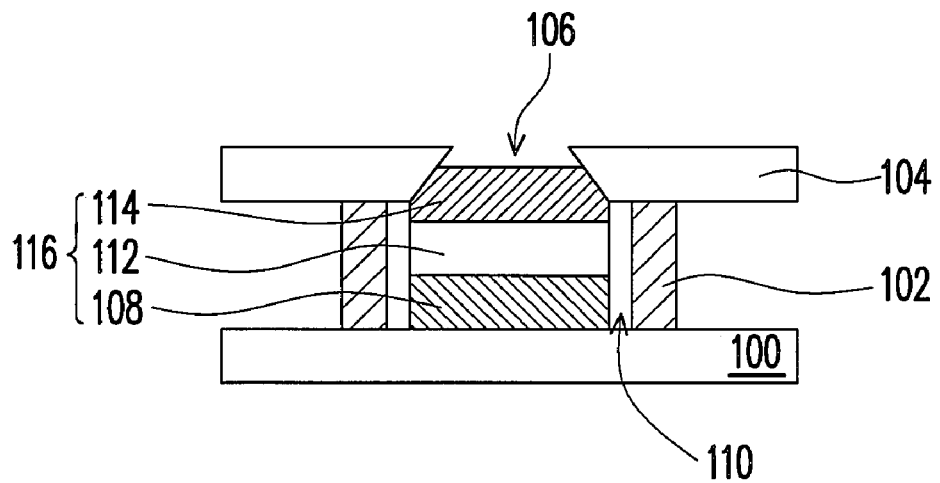

Referring to FIGS. 1C and 2C, the shadow mask 104 is used as a mask again to form a semiconductor layer 112 on the source/drain layer 108 exposed by the opening 106. The material of the semiconductor layer 112 includes N-type organic semiconductor material, P-type organic semiconductor material, small molecule organic semiconductor material or macromolecule organic semiconductor material, for example, pentacene or poly-(3-hexylthiophene) (i.e. P3HT). The semiconductor layer 112 can also include zinc oxide or doped inorganic semiconductor material. The method for forming the semiconductor layer 112 includes PVD process or jet coating process, for example a sputtering process or a vapor deposition process.

Next, the shadow mask 104 is used as the mask once again to form a source/drain layer 114 on the semiconductor layer 112 exposed by the opening 106. The material of the source/drain layer 114 includes a conductive material, for example, metal (aluminum, copper, molybdenum, chromium or alloy of the above-mentioned metals). The method for forming the source/drain layer 114 includes PVD process, for example, a sputtering process or a vapor deposition process. The source/ drain layer 108, the semiconductor layer 112 and the source/drain layer 114 are together to form a stacked layer 116 and there is also a gap 110 between the stacked layer 116 and the gate layer 110.

Figure 1D:
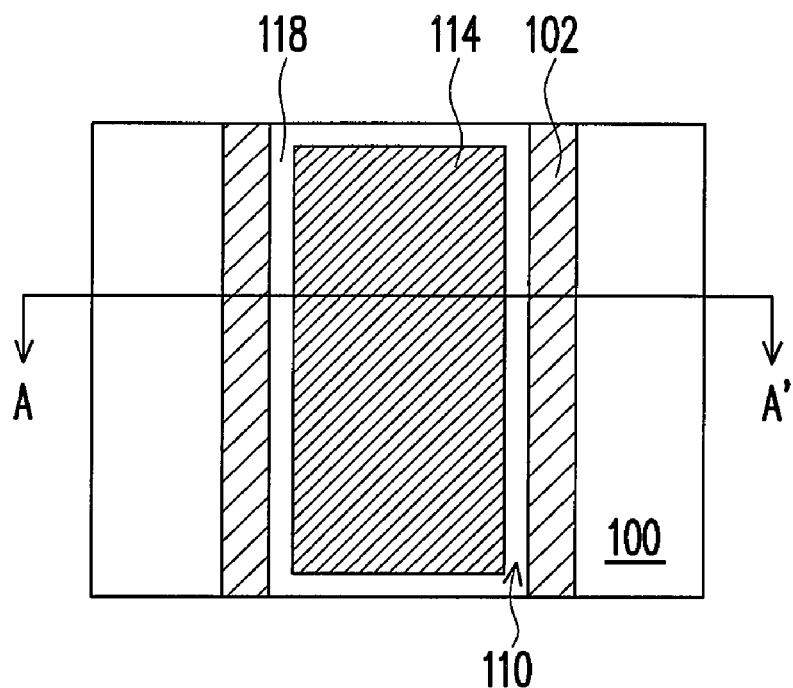
Figure 2D:
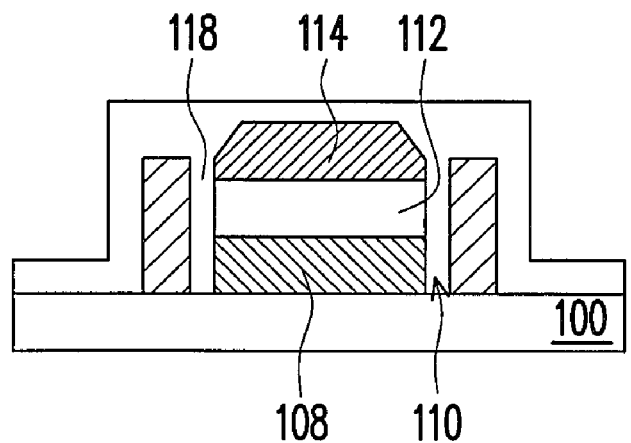

Referring to FIGS. 1D and 2D, after removing the shadow mask 104, a gate dielectric layer 118 is formed in the gap between the stacked layer 116 and the gate layer 110, wherein the gate dielectric layer 118 entirely and continuously covers the substrate 100 and the top surface and the side walls of the gate layer 102 and the stacked layer 116. The material of the gate dielectric layer 118 includes, for example, silicon oxide, silicon nitride or an organic dielectric layer. The method for forming the gate dielectric layer 118 includes, for example, CVD process, printing process, spin coating process, ink-jetting process, soaking process or vapor deposition process.

In the first embodiment of the present invention, since the gate layer 102 and an outer conductive trace (not shown) thereof are defined at first, followed by forming the source/drain layer 108, the semiconductor layer 112 and the source/drain layer 114 using the shadow mask, therefore, the gate layer 102 can serve as ribs, so that the coating areas of the source/drain layer 108, the semiconductor layer 112 and the source/drain layer 114 can be precisely controlled after placing the shadow mask thereon. Thus, short circuit may be effectively avoided.

Furthermore, by precisely controlling the thickness of the gate layer 102, the coating areas of the source/drain layer 108, the semiconductor layer 112 and the source/drain layer 114 may be precisely controlled, and the risk of shorting between the gate layer 102 and the stacked layer 116 may also be prevented after forming the gate dielectric layer 118, and a thinner gate dielectric layer 118 obtained by precisely controlling the thickness of the gate layer 102 so that the operation bias voltage of the device can be reduced and the device may have a lager start current.

Moreover, according to an embodiment of the present invention, after forming the semiconductor layer, no photolithography process is required, so that damage to the semiconductor layer may be avoided and a device with desired electrical characteristics may be obtained.

The Second Embodiment

FIG. 3A~FIG. 3D are schematic cross-sectional views of a process of fabricating a vertical OTFT according to a second embodiment of the present invention.

Figure 3A:
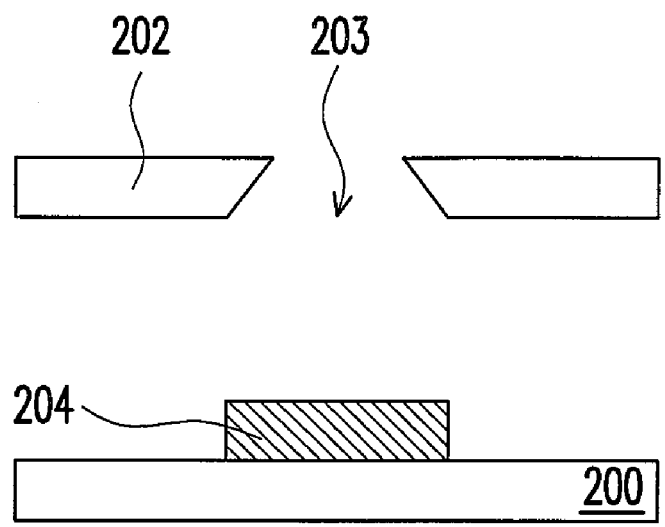
FIG. 3A~FIG. 3D are schematic cross-sectional views showing the process steps of fabricating a vertical OTFT according to a second embodiment of the present invention.

Referring to FIG. 3A, first, a substrate 200 is provided. The substrate 200 can be, for example, a flexible plastic substrate, a silicon substrate, a flexible substrate or a transparent glass substrate.

Next, a shadow mask 202 is disposed over the substrate 200. The shadow mask 202 has an opening 203 to expose a portion of the substrate 200. The shadow mask 202 may be included of, for example, thin steel sheet, silicon wafer or acrylic plate and the like.

Next, taking the shadow mask 202 as the mask, a source/drain layer 204 is formed on the portion of the substrate 200 exposed by the opening 203. The source/drain layer 204 includes a conductive material, for example, metal (aluminum, copper, molybdenum, chromium or alloy of the above-mentioned metals). The method for forming the source/drain layer 204 includes a PVD process, for example, a sputtering process or a vapor deposition process.

Figure 3B:
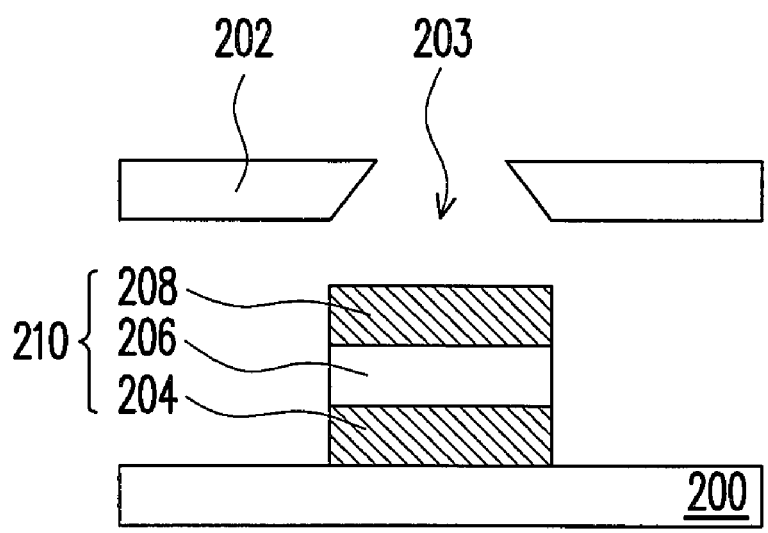

Referring to FIG. 3B, the shadow mask 202 is used as a mask again to form a semiconductor layer 206 on the source/drain layer 204 exposed by the opening 203. The semiconductor layer 206 includes N-type organic semiconductor material, P-type organic semiconductor material, small molecule organic semiconductor material or macromolecule organic semiconductor material, for example, pentacene or poly-(3-hexylthiophene) (i.e. P3HT). The semiconductor layer 206 may also include zinc oxide or doped inorganic semiconductor material. The method for forming the semiconductor layer 206 includes PVD process or jet coating process, wherein the PVD process includes sputtering process or vapor deposition process.

Next, the shadow mask 202 is used as the mask once again to form a source/drain layer 208 on the semiconductor layer 206 exposed by the opening 203. The source/drain layer 208 includes a conductive material, for example, a metal (aluminum, copper, molybdenum, chromium or alloy of the above-mentioned metals). The method for forming the source/drain layer 208 includes PVD process, for example, s sputtering process or s vapor deposition process. The source/drain layer 208, the semiconductor layer 206 and the source/drain layer 204 are together to form a stacked layer 210.

Figure 3C:
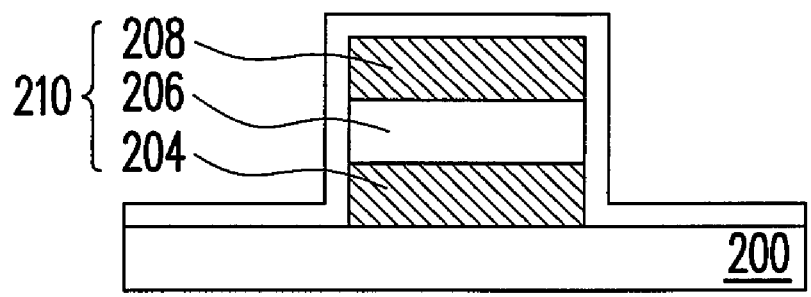

Referring to FIG. 3C, after removing the shadow mask 202, a gate dielectric layer 212 is formed on the substrate 200 and the gate dielectric layer 212 entirely and continuously covers the top surface and the side walls of the stacked layer 210. The gate dielectric layer 212 includes, for example, a silicon oxide, a silicon nitride or an organic dielectric layer. The method for forming the gate dielectric layer 212 includes, for example, CVD process, printing process, spin coating process, ink-jetting process, soaking process or vapor deposition process.

Figure 3D:
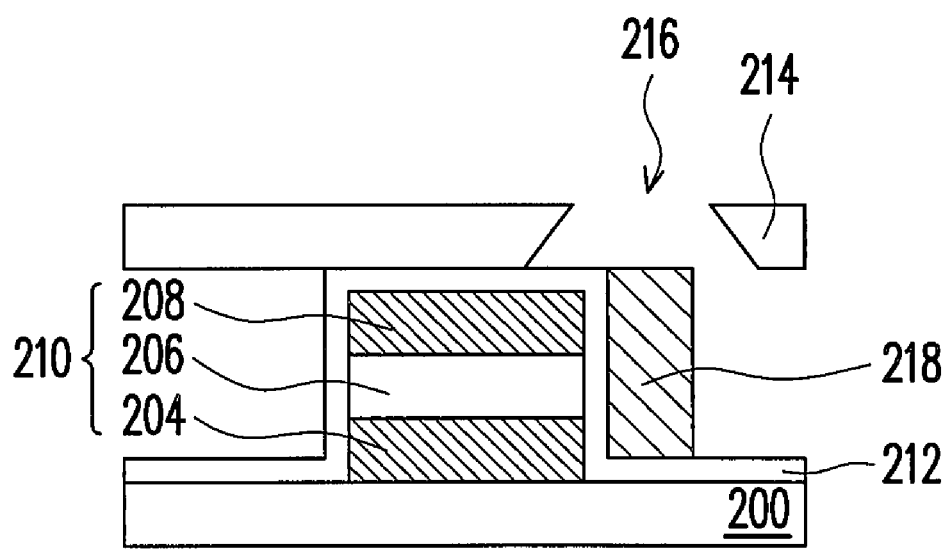

Referring to FIG. 3D, another shadow mask 214 is disposed over the stacked layer 210. The shadow mask 214 has an opening 216 to expose a side of the stacked layer 210. Using the shadow mask 214 as the mask, a gate layer 218 is formed at the above-mentioned side of the stacked layer 210. The gate layer 218 includes a conductive material, for example, a metal (aluminum, copper, molybdenum, chromium or alloy of the above-mentioned metals). The method for forming the gate layer 218 includes PVD process, for example, a sputtering process or a vapor deposition process. Thereafter, the shadow mask 214 is removed.

In the second embodiment of the present invention, since the source/drain layer 204, the semiconductor layer 206 and the source/drain layer 208 are fabricated by using the shadow mask 202, therefore, the coating areas and the thicknesses of the source/drain layer 204, the semiconductor layer 206 and the source/drain layer 208 can be precisely controlled.

After forming the gate dielectric layer 212, the shadow mask 214 is used to fabricate the gate layer 218, and therefore shorting between the gate layer 218 and the stacked layer 210 may be avoided. Furthermore, because a thinner gate dielectric layer 212 may reduce the operation bias voltage of the device and the device may have a larger start current.

Moreover, according to an of the present invention, after forming the semiconductor layer, no photolithography process is required so that damage of the semiconductor layer may be avoided and a device with desired electrical characteristics may be obtained.

In summary, since a single mask is used to define the drain, the semiconductor layer and the source, and therefore the process is simplified and can be used to realize the integration of the devices in an application with a large area, in particular, is suitable for a display application. The feature of fabricating a vertical OTFT at a lower temperature would render the OTFT have a lower operation bias voltage and have the better electrical characteristics.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A method of fabricating a vertical thin film transistor, comprising:
providing a substrate, having a patterned gate layer formed thereon, wherein the gate layer has an opening;
disposing a shadow mask over the gate layer, and exposing a portion of the substrate at a side of the gate layer;
sequentially forming a first source/drain layer, a semiconductor layer and a second source/drain layer on the substrate exposed by the opening by using the shadow mask as a mask;
removing the shadow mask; and
forming a gate dielectric layer between the gate layer and a stacked layer composed of the first source/drain layer, the semiconductor layer and the second source/drain layer.

2. The method of fabrication a vertical thin film transistor as recited in claim 1, wherein the material of the first source/drain layer and the second source/drain layer comprise conductive material.

3. The method of fabricating a vertical thin film transistor as recited in claim 2, wherein the first source/drain layer and the second source/drain layer is formed by performing a physical vapor deposition process.

4. The method of fabricating a vertical thin film transistor as recited in claim 1, wherein the physical vapor deposition process comprises a sputtering process or a vapor deposition process.

5. The method of fabricating a vertical thin film transistor as recited in claim 1, wherein the material of the semiconductor layer comprises an organic semiconductor material or an inorganic semiconductor material.

6. The method of fabricating a vertical thin film transistor as recited in claim 1, wherein the semiconductor layer comprises an N-type organic semiconductor material, a P-type organic semiconductor material, a small molecule organic semiconductor material or a macromolecule organic semiconductor material, or zinc oxide or a doped inorganic semiconductor material.

7. The method of fabricating a vertical thin film transistor as recited in claim 5, wherein the semiconductor layer comprises a physical vapor deposition process or a jet coating process.

8. The method of fabricating a vertical thin film transistor as recited in claim 7, wherein the physical vapor deposition process comprises a sputtering process or a vapor deposition process.

9. The method of fabricating a vertical thin film transistor as recited in claim 1, wherein the gate dielectric layer is formed by performing a chemical vapor deposition process, a printing process, a spin coating process, an ink-jetting process, a soaking process or a vapor deposition process.

10. The method of fabricating a vertical thin film transistor as recited in claim 1, wherein the substrate comprises a silicon substrate, a flexible substrate or a glass substrate.

* * * * *